United States Patent
Hyvönen et al.

(10) Patent No.: US 7,257,030 B2
(45) Date of Patent: Aug. 14, 2007

(54) OPERATING A STORAGE COMPONENT

(75) Inventors: Jani Hyvönen, Tampere (FI); Kimmo Mylly, Julkujärvi (FI); Marko T. Ahvenainen, Ruutana (FI)

(73) Assignee: Nokia Corporation, Espoo (FI)

( * ) Notice: Subject to any disclaimer, the term of this patent is extended or adjusted under 35 U.S.C. 154(b) by 165 days.

(21) Appl. No.: 11/145,527

(22) Filed: Jun. 3, 2005

(65) Prior Publication Data

US 2005/0286298 A1  Dec. 29, 2005

(30) Foreign Application Priority Data

Jun. 7, 2004  (WO) ................. PCT/IB2004/001833

(51) Int. Cl.
*G11C 7/00* (2006.01)
*G11C 8/00* (2006.01)

(52) U.S. Cl. ..................... 365/185.22; 365/189.01; 365/189.05

(58) Field of Classification Search ........... 365/189.01, 365/185.22, 189.05
See application file for complete search history.

(56) References Cited

U.S. PATENT DOCUMENTS

| | | |
|---|---|---|
| 4,388,695 A | 6/1983 | Heinemann |
| 5,530,938 A | 6/1996 | Akasaka et al. |
| 6,192,488 B1 | 2/2001 | Li |
| 2003/0086299 A1* | 5/2003 | Yoshida .................. 365/185.22 |
| 2004/0064639 A1* | 4/2004 | Sicola et al. ................ 711/114 |

FOREIGN PATENT DOCUMENTS

EP  0952525  10/1999

OTHER PUBLICATIONS

"AVR105: Power Efficient High Endurance Parameter Storage in Flash Memory;" ATMEL Application Note; Sep. 2003; CP002312734, p. 1, line 1 through p. 3, line 16; p. 4, line 42 through p. 5; line 10; and p. 6, line 41 through p. 9, last line.

"Eprom Redundancy;" IBM Technical Disclosure Bulletin, IBM Corp., New York, US; Jan. 8, 1989; vol. 31, No. 8, pp. 73-74; XP000111863 ISSN: 0018-8689, whole document.

* cited by examiner

*Primary Examiner*—Son Dinh
(74) *Attorney, Agent, or Firm*—Alfred A. Fressola; Ware, Fressola, Van Der Sluys & Adolphson LLP

(57) ABSTRACT

The invention relates to a method of operating a storage component 10, 30, 40. In order to enable a verification of the integrity of the data in the storage component, it is proposed that first a write operation for storing data in a data storage area 11, 31, 41 of the storage component 10, 30, 40 is performed. Then, a completion status field 15, 35, 45 in the storage component 10, 30, 40 is updated, in case the write operation has been completed successfully. The updated completion status field 15, 35, 45 indicates that the write operation has been completed successfully. The invention relates equally to a corresponding storage component and to a corresponding system.

31 Claims, 5 Drawing Sheets

OPERATING A STORAGE COMPONENT

CROSS-REFERENCE TO RELATED APPLICATIONS

This application claims priority under 35 USC §119 to International Patent Application No. PCT/IB2004/001833 filed on Jun. 7, 2004.

FIELD OF THE INVENTION

The invention relates to a method of operating a storage component. The invention relates equally to such a storage component and to a system comprising such a storage component.

BACKGROUND OF THE INVENTION

A storage component stores data under control of some processing component. A memory card or a memory stick, for instance, is a storage component which can be connected to various devices comprising a processing component for enabling a flexible storage of data.

A write operation which is performed by a processing component for storing data in a storage component can be interrupted in an uncontrolled way due to various error situations, for example due to a sudden interruption in the power supply of the processing component.

When recovering from an error situation, the processing component is not able to check the data integrity in the storage component, that is, the processing component does not know whether the last write operation has been successfully completed or not. Also the storage component itself is not able to determine whether the last write operation has been successfully completed or not.

In document U.S. Pat. No. 4,388,695, it is mentioned to be known to set and reset an extra bit of a memory depending on whether a particular byte is protected or not. Whenever a write cycle is attempted, the corresponding bit for the addressed byte is read. If the bit is set for "write protect", it blocks the write pulse. This protection scheme is only able to prevent an uncontrolled writing in a protected area in case of an error situation in a writing software, though. It is not able to indicate whether the last write operation has been successfully completed or not.

SUMMARY OF THE INVENTION

It is an object of the invention to enable a verification of the integrity of data stored in a storage component.

A method of operating a storage component is proposed, which comprises performing a write operation for storing data in a data storage area of the storage component. The method further comprises in case the write operation has been completed successfully, updating a completion status field in the storage component. The updated completion status field indicates that the write operation has been completed successfully.

Moreover, a storage component is proposed which comprises a data storage area which is arranged for storing data in a respective write operation. The storage component further comprises a completion status field which is arranged for being updated after a respective completed write operation to comprise an indication that said write operation has been completed successfully.

The storage component can be for instance a memory card or memory stick, but equally any other kind of storage component.

Finally, a system is proposed which comprises such a storage component and in addition a processing component which is adapted to provide data for a write operation in the storage component.

The storage component and the processing component can be integrated in a single device. Alternatively, the storage component and the processing component can form separate devices or be integrated in separate devices, respectively.

The invention proceeds from the idea that the storage component itself could comprise information indicating whether the last commenced write operation has been successfully completed. It is proposed that such information is stored in a field of the storage component, this field being referred to as completion status field. The information is updated for any write operation or only for each write operation which might be critical in preserving the integrity of the data in the storage component.

It is an advantage of the invention that it enables to determine immediately whether a preceding write operation has been completed successfully, simply by checking the completion status field.

In order to ensure that the completion status field indicates only in case of a successful write operation that the write operation has been completed successfully, the completion status field is updated in one embodiment of the invention before each write operation to comprise an indication that a write operation has not been completed successfully. The indication can then be realized by a single bit, one value indicating a successful write operation and another value indicating an interrupted write operation.

The completion status field may indicate exclusively whether the last write operation has been successfully completed. Alternatively, the completion status field may comprise various types of additional information. Such additional information may be for example address information and/or the file that is currently being transferred. The included types of information may be fixed or defined by a programmer. The whole write operation could thus be encapsulated within different status values of the completion status field.

In one embodiment of the invention, data which is to be written into the data storage area is first buffered in a buffer, in case the preceding write operation is indicated by the completion status field to have been completed successfully. In addition, address information indicating the address in the data storage area to which the data is to be written is stored. In case the completion status field indicates at some point that a preceding write operation has not been completed successfully, the data in the data storage area can then be restored with the data buffered in the buffer in accordance with the associated address information.

In another embodiment of the invention, backup data is generated whenever a write operation has been completed successfully. The backup data is generated at least for a part of the data which is written to the storage component and stored in a backup data area of the storage component. It is an advantage of this embodiment that the backup data can be used for restoring the data in the data storage area whenever the completion status field indicates that a subsequent write operation has been interrupted in an uncontrolled way.

It is to be understood that in both embodiments, a check of the completion status field and a possibly required restoration of data can be carried out at any suitable point of time, for instance before each write operation and/or before each read operation which is performed for reading stored data from the data storage area.

In one embodiment of the invention, the completion status field indicates for each write operation whether it has been completed successfully. In another embodiment of the invention, the completion status field indicates only whether the last write operation for a critical data area of the data storage area has been completed. The critical data area is an area which is considered critical in preserving the integrity of the data area of the storage component. Commands may be defined which allow a programmer to specify the data storage part of the storage component which is to be considered as critical data area. Even if the completion status field indicates for each write operation whether it has been completed successfully, only critical data might be buffered or used for backup data.

The completion status field can be realized in various parts of a storage component.

In one embodiment of the invention, the completion status field is defined in the data storage area of the storage device at a fixed and known logical address. Allocating such a field and ensuring that it is valid might be complicated, though.

In another embodiment of the invention, the completion status field is defined in a separate register of the storage component. The register can be a newly defined register, for example a register defined specifically for the purpose of the invention. A new register requires in addition that new commands are defined for enabling a control of the register. Alternatively, the completion status field could be defined in a register which is present in the storage component anyhow. In this case, commands for accessing the register are already available. Some memory cards, for example, are provided with a register called Card Specific Data (CSD) register. This register contains different types of operation parameters, including information on how to access the card contents. The CSD register usually has a free bit field available which could be defined as completion status field.

In yet another embodiment of the invention, the completion status field is defined in a field of the storage component which is of a very high endurance memory type. This embodiment is particularly suited for storing in the completion status field not only an indication whether the last write operation has been completed successfully, but equally an address for buffered data.

In one embodiment of the invention, a processing component external to the storage component takes care of controlling the write operation and of updating the completion status field. This embodiment includes the risk that the updating of the completion status field itself is disturbed due to an error situation in the processing component. In another embodiment of the invention, the storage component takes care of controlling the write operation and of updating the completion status field.

BRIEF DESCRIPTION OF THE FIGURES

Other objects and features of the present invention will become apparent from the following detailed description considered in conjunction with the accompanying drawings.

DETAILED DESCRIPTION OF THE INVENTION

Figure 1:
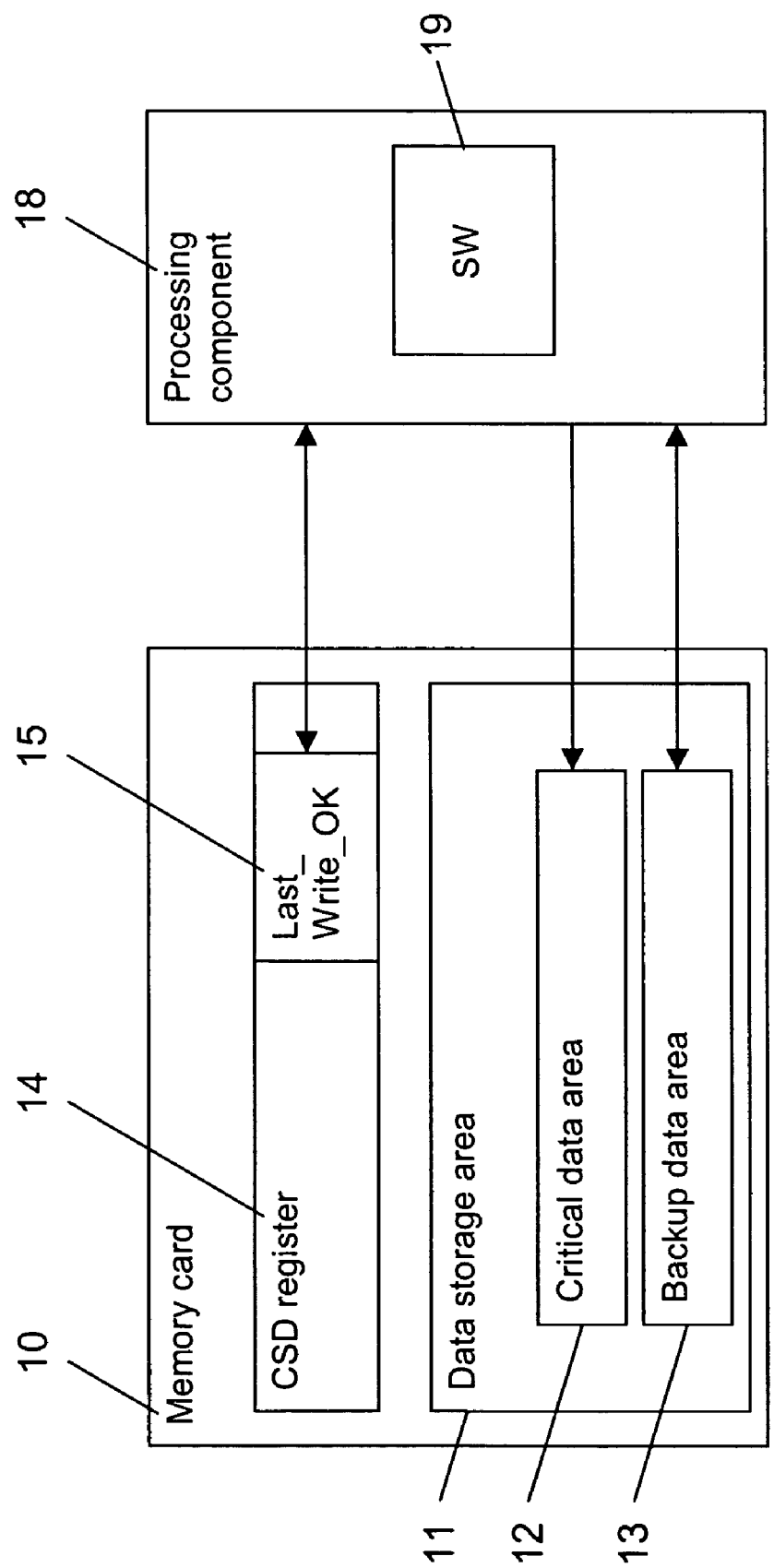
FIG. 1 is a block diagram of a system according to a first embodiment of the invention.

FIG. 1 is a block diagram of a first system which allows preserving the data integrity of a storage component in accordance with the invention.

The system of FIG. 1 comprises a memory card 10 as a storage component and a processing component 18.

The memory card 10 comprises a data storage area 11 including an area for critical data 12 and an area for backup data 13. The memory card 10 further comprises a CSD register 14 as known from the art. A free bit field 15 of the CSD register 14 is defined as a Last_Write_OK field, which contains information about the completion of the respectively last write operation. The Last_Write_OK field 15 thus constitutes the completion status field of the invention.

The processing component 18 can be for example a processing component of some host device, like a personal computer. It runs a software SW 19 for interacting with the memory card 10 when the memory card 10 is connected to the processing component 18, for instance when the memory card 10 is inserted into a personal computer comprising the processing component 18.

A procedure embedding the write operation in the system of FIG. 1 will now be described in more detail with reference to the flow chart of FIG. 2.

In case new data is to be written to the data storage area 11 of the memory card 10, the processing component 18 first checks the current value of the bit in the Last_Write_OK field 15 of the memory card 10.

If the bit in the Last_Write_OK field 15 has a value of '1', the processing component 18 can assume that the preceding write operation had been successfully completed.

In this case, the processing component 18 now sets the value of the bit in the Last_Write_OK field 15 to '0'. Next, the processing component 18 performs the actual write operation in a conventional manner, including a possible update of the critical data area 12.

When the write operation has been completed, the processing component 18 sets the value of the bit in the Last_Write_OK field 15 to '1' again. When the write operation is interrupted before it has been completed, for instance due to a power failure, the procedure is terminated, and the bit in the Last_Write_OK field 15 still has a value of '0'. The latter alternative is indicated by a dashed line.

Finally, the processing component 18 generates a backup file with data corresponding to the new data in the critical data area 12 and stores it in the backup data area 13.

In case the processing component 18 detects in contrast at the very beginning of the described procedure that the bit in the Last_Write_OK field 15 has a value of '0', the processing component 18 can assume that the last write operation had not been completed successfully. In this case, the processing component 18 first retrieves the backup data from the backup data area 13 and writes this old critical data back into the critical data area 12.

Only then, the processing component 18 continues with the actual write operation as described above.

It is to be understood that instead of relying on the known CSD register, a new register could be defined which comprises the Last_Write_OK field. The write operation could then be embedded in exactly the same procedure as described with reference to FIG. 2.

Figure 3:
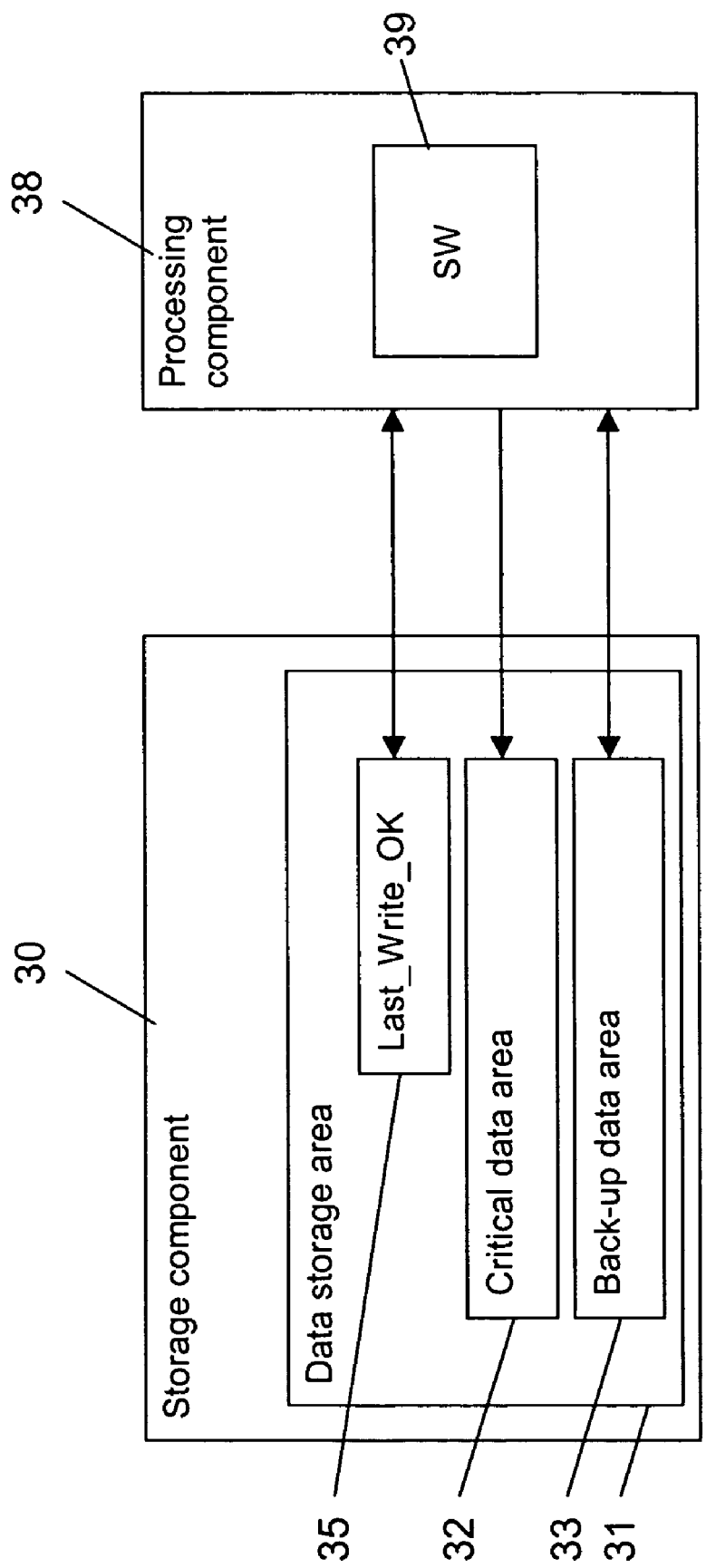
FIG. 3 is a block diagram of a system according to a second embodiment of the invention.

FIG. 3 is a block diagram of a second system which allows preserving the data integrity of a storage component in accordance with the invention.

The system of FIG. 3 comprises a storage component 30 and a processing component 38. The storage component 30 and the processing component can be integrated for example in a single device, like a personal computer.

The storage component 30 comprises a data storage area 31 including an area for critical data 32 and an area for backup data 33. In addition, a field 35 in the data storage area 31 is defined as a Last_Write_OK field. The Last_Write_OK field 35 has a known and constant logical address and contains information about the completion of the respectively last write operation. The Last_Write_OK 35 field thus constitutes the completion status field of the invention.

The processing component 38 runs a software SW 39 for interacting with the storage component 30.

A procedure embedding the write operation in the system of FIG. 3 corresponds exactly to the procedure in the system of FIG. 1 described with reference to FIG. 2, except that the Last_Write_OK field 35 is part of the data storage area 31, not part of the CSD register 14 as in the system of FIG. 1.

Figure 2:
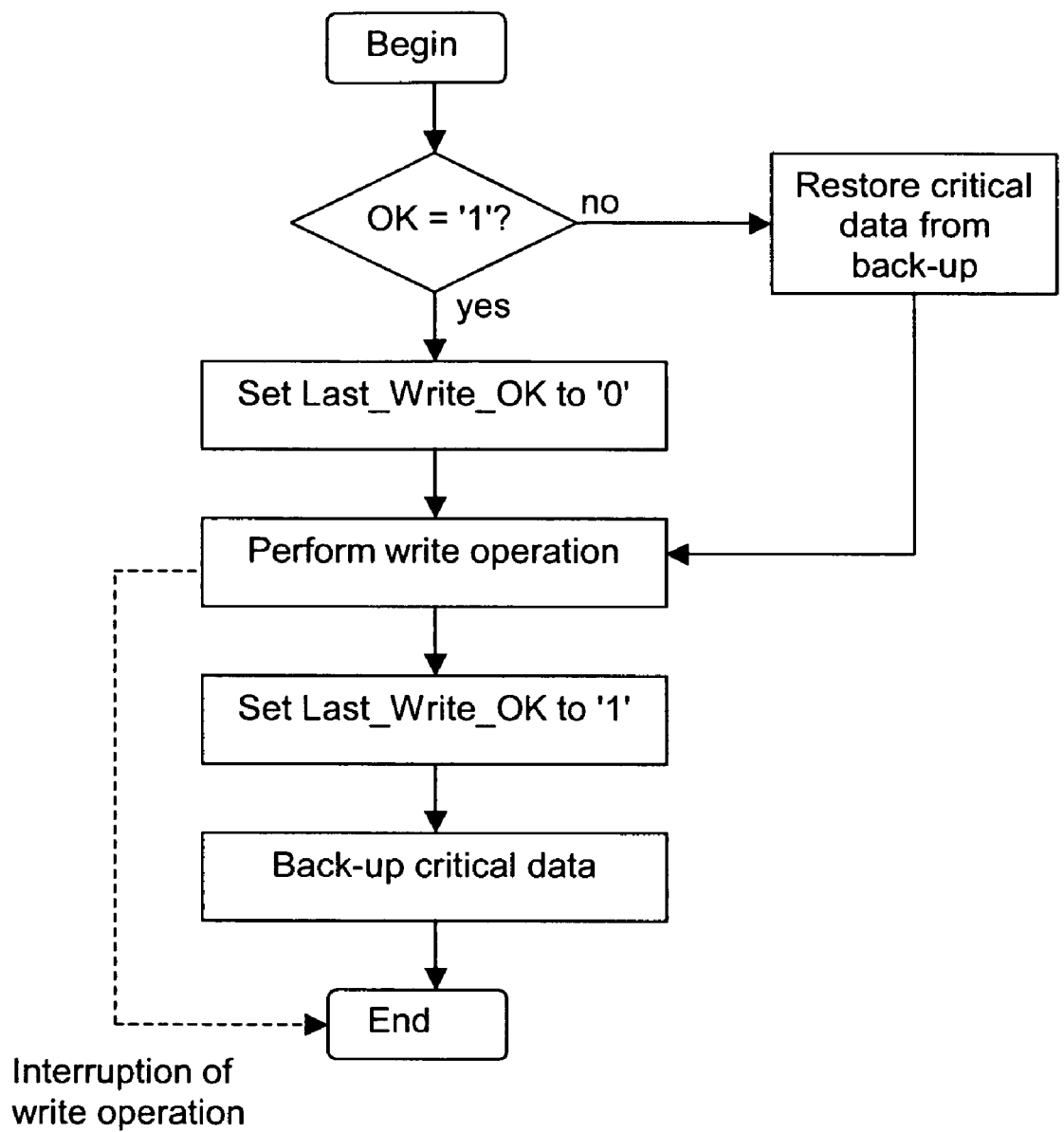
FIG. 2 is a flow chart illustrating a procedure carried out in the system of FIG. 1.

It is to be understood that a required restoration of data based on the available back-up data can be performed at any suitable time in the system of FIG. 1 and FIG. 3, respectively, not only before a respective write operation as indicated in FIG. 2.

For example, the Last_Write_OK field 15, 35 may be checked before each read operation. In case data is to be read from the data storage area 11, 31 of the memory card 10, 30, the processing component 18, 38 first checks the current value of the bit in the Last_Write_OK field 15, 35 of the memory card 10, 30. If the bit in the Last_Write_OK field 15, 35 has a value of '1', the processing component 18, 38 can assume that the preceding write operation had been successfully completed and the read operation is carried out immediately. If the bit in the Last_Write_OK field 15, 35 has a value of '0', in contrast, the processing component 18, 38 assumes that the preceding write operation had not been successfully completed. In this case, the processing component 18, 38 first restores the data in the critical data area 12, 32 with data from the back-up data area 13, 33. Moreover, the processing component 18, 38 sets the value of the bit in the Last_Write_OK field 15, 35 to '1'. Only then, the processing component 18, 38 carries out the actual read operation.

Figure 4:
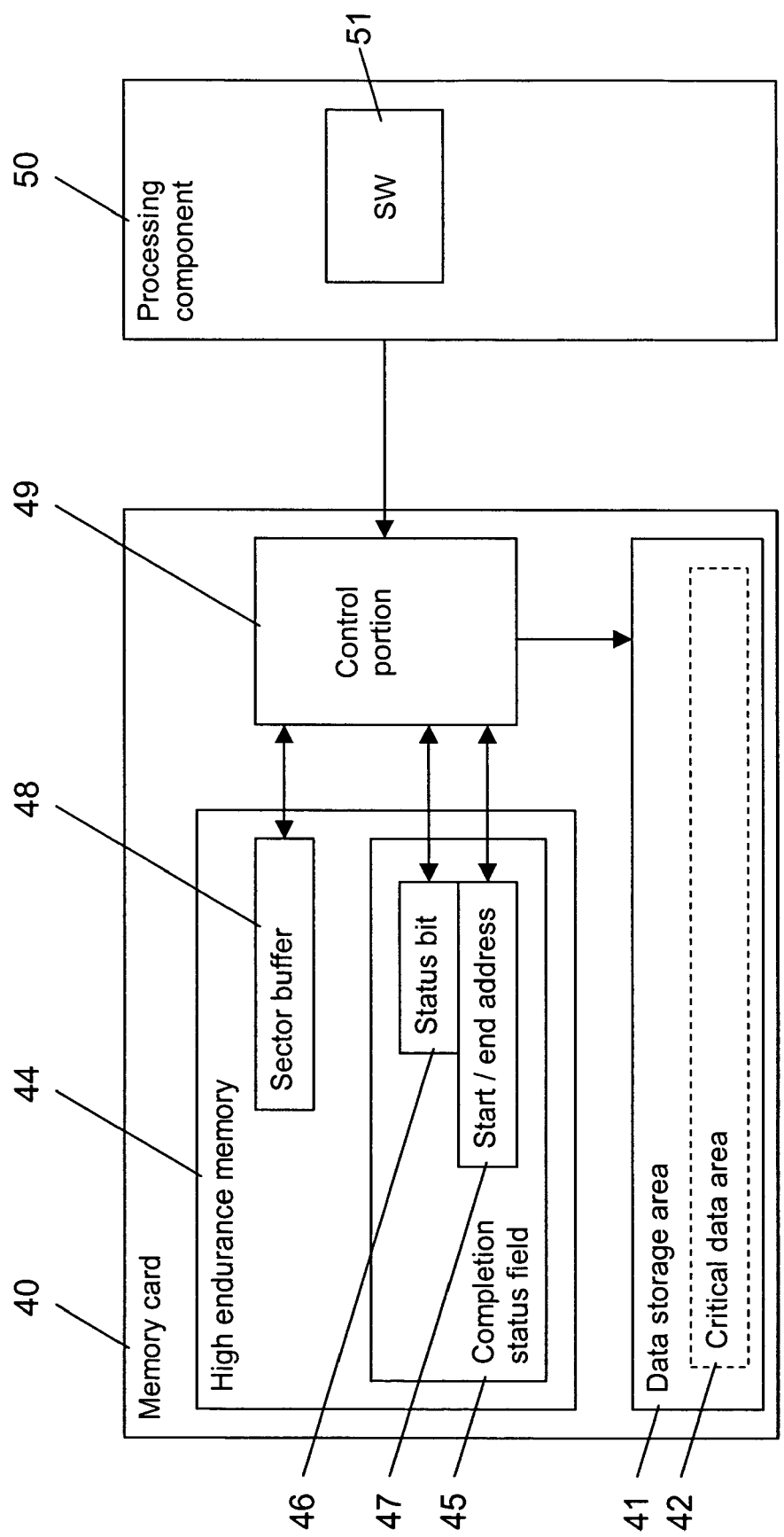
FIG. 4 is a block diagram of a system according to a third embodiment of the invention.

FIG. 4 is a block diagram of a third system which allows preserving the data integrity of a storage component in accordance with the invention.

The system of FIG. 4 comprises a memory card 40 as a storage component and a processing component 50.

The memory card 40 comprises a data storage area 41, a very high endurance memory part 44 and a control portion 49. The control portion 49 has access to both, the data storage area 41 and the high endurance memory part 44.

The high endurance memory part 44 includes a completion status field 45 and a sector buffer 48. The completion status field 45 further comprises a status bit field 46 and an address field 47.

The high endurance memory part 44 may be relatively small compared to the data storage area 41.

The processing component 50 can be for example a processing component of some host device, like a mobile terminal. It runs a software SW 51 for interacting with the memory card 40 when the memory card 40 is connected to the processing component 50, for instance when the memory card 40 is inserted into a mobile terminal comprising the processing component 50.

A procedure embedding the write operation in the system of FIG. 4 will now be described with reference to the flow chart of FIG. 5.

When the processing component 50 notifies the control portion 49 of the memory card 40 that new data is to be written to the data storage area 41 of the memory card 40, the control portion 49 first checks the current value of the bit in the status bit field 46. In case the value is '1', the control portion 49 can assume that the preceding write operation had been completed successfully.

Thereupon, the control portion 49 copies a sector or a certain number of sectors of data received from the processing component 50 to the sector buffer 48. In addition, the control portion 49 writes an address information to the address field 47. The address information is provided by the processing component 50 and points to an address in the data storage area 41 to which the data in the sector buffer 48 is addressed. The address information may point more specifically to a start address and/or an end address to which the data is to be written.

The value of the bit in the status bit field 46 is then set by the control portion 49 to '0'. This indicates that the address in the address field 47 is now valid.

When the buffering of data or the storing of address information is interrupted, in contrast, for instance due to a power failure, the procedure is terminated. In this case, the status bit field 46 keeps the value of '1', indicating that the address in the address field 47 is not valid. This alternative is represented in FIG. 5 by dashed lines.

Next, the control portion 49 writes the data from the sector buffer 48 to the data storage area 41 in accordance with the provided address information. As soon as the writing has been completed, the control portion 49 sets the value of the bit in the status bit field 46 to '1'. This indicates that the address in the address field is not valid anymore, but that the write operation for the current sector or sectors has been completed successfully.

When the writing of buffered data into the data storage area 41 is interrupted, in contrast, the procedure is terminated. In this case, the status bit field 46 keeps a value of '0', indicating that the last write operation has not been completed successfully, but that the address information in the address field 47 is still valid. This alternative is represented in FIG. 5 as well by dashed lines.

As long as further sectors of data have to be written to the data storage area 41 and the procedure is not interrupted, the last part of the described procedure is continued in a loop, starting off with copying the next data sector or sectors into the sector buffer 48.

In case the control portion 49 detects in contrast at the very beginning of the described procedure that the bit in the status bit field 46 has a value of '0', the control portion 49 can assume that the last write operation had not been completed successfully. In this case, two intermediate steps are performed before the procedure is continued.

As a first intermediate steps, the control portion 49 retrieves the address information which is stored in the address field 47 and the data which is buffered in the sector buffer 48. The control portion 49 then corrects the detected failure by writing the retrieved data into the data storage area 41 in accordance with the retrieved address information for this data. As a second intermediate step, the control portion 49 sets the value of the bit in the status bit field 46 to '1'.

This indicates that the address in the address field is not valid anymore, but that a write operation has been completed successfully.

Only then, the control portion 49 copies the new data sector or sectors provided by the processing component 50 to the sector buffer 48 and continues as described above.

Figure 5:
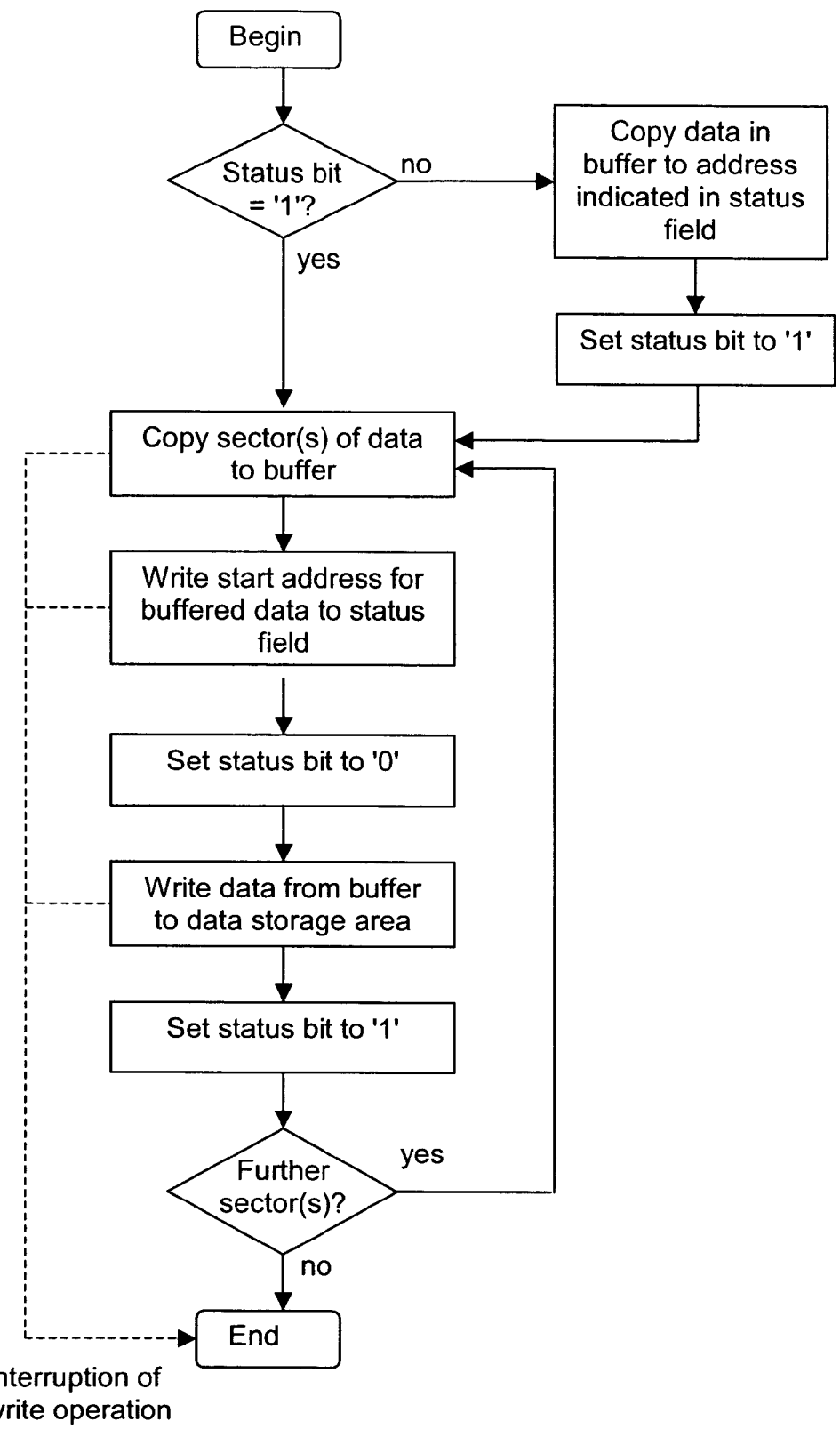
FIG. 5 is a flow chart illustrating a procedure carried out in the system of FIG. 4.

It is to be understood that a required restoration of data based on the buffered data can be performed at any suitable time in the system of FIG. 4, not only before a respective write operation as indicated in FIG. 5.

For example, the status bit field 46 may be checked by the control portion 49 before each read operation announced by the processing component 50. In case data is to be read from the data storage area 41 of the memory card 40, the control portion 49 first checks the current value of the bit in the status bit field 46. If the bit in the status bit field 46 has a value of '1', the control portion 49 can assume that the preceding write operation had been successfully completed and the read operation is carried out immediately. If the bit in the status bit field 46 has a value of '0', in contrast, the control portion 49 assumes that the preceding write operation had not been successfully completed. In this case, the control portion 49 first restores the data with data from the sector buffer 48 in accordance with the address information in the address field 47. Moreover, the control portion 49 sets the value of the bit in the status bit field 46 to '1'. Only then, the read operation is carried out.

The procedure performed in the system of FIG. 4 ensures that complete sectors are written to the data storage area 41 of the memory card 40.

The system of FIG. 4 is further particularly flexible, and the employed high endurance memory part ensures a particularly reliable protection of the data.

In the system of FIG. 4, a critical data area 42 could be specified in the data storage area 41, as indicated in FIG. 4 with dashed lines. The critical data area 42 could be specified for instance by a programmer with a command or with commands specified for this purpose. The procedure described with reference to FIG. 5 may then be performed only in case data is to be written to the critical data area 42. Otherwise, the data is written directly into the data storage area 41.

Since in the system of FIG. 4, the data sectors are buffered in the sector buffer 48 before they are written into the data storage area 41, it is not necessary to create backup data once the actual write operation has been successfully completed, as in the systems of FIGS. 1 and 3. It is to be understood, however, that alternatively, the sector buffer 48 could also contain backup data. In this case, it would be possible to recover the situation before the interrupted write operation based on the buffered backup data, similarly as in the systems of FIGS. 1 and 3, instead of completing an interrupted write operation based on the buffered new data.

In the system of FIG. 4, the status check and the possible recovery of the data storage area are taken care of by the memory card 40 itself. This allows to reduce the overhead in the interactions with the processing component 50. It is to be understood, however, that it could also be left to the processing component 50, and thus to the programmer of the software 51 run by the processing component 50, to decide in which cases it is necessary to perform the check and to restore data by transferring data from the sector buffer 48 to the data storage area 41. In this case, the processing component 50 could cause a recovery of data for instance after a sudden power loss during a write operation.

On the other hand, in the systems of FIGS. 1 and 3, the status check and the possible recovery of the data storage area are taken care of by the respective processing component. It is to be understood that in these systems, it could also be left to the respective storage component to take care of the status check and the recovery of data based on stored backup data, similarly as in the system of FIG. 4.

Finally, it is to be noted that the described embodiments constitute only some of a large variety of possible embodiments of the invention.

What is claimed is:

1. A method of operating a storage component, said method comprising:
    performing a write operation for storing data in a data storage area of said storage component;
    in case said write operation has been completed successfully, updating a completion status field in said storage component, said updated completion status field indicating that said write operation has been completed successfully; and
    before performing said write operation, checking said completion status field and, in case said completion status field indicates that a preceding write operation has been completed successfully, updating said completion status field, said undated completion status field indicating that a preceding write operation has not been completed successfully.

2. The method according to claim 1, further comprising before performing said write operation, checking said completion status field and, in case said completion status field indicates that a preceding write operation has been completed successfully, buffering data for said write operation in a buffer having a high endurance and storing address information for said buffered data in a memory part having a high endurance.

3. The method according to claim 2, further comprising at some point of time checking said completion status field and, in case said completion status field indicates that a preceding write operation has not been completed successfully, restoring data in said data storage area with data buffered in said buffer in accordance with said associated stored address information.

4. The method according to claim 3, wherein said checking of said completion status field and, if applicable, said restoring of data is carried out either before performing a respective write operation and/or before performing a respective read operation.

5. The method according to claim 1, further comprising in case said write operation has been completed successfully, storing at least part of said data in addition as backup data.

6. The method according to claim 1, wherein a part of said data storage area is defined as a critical data area, said method further comprising in case said write operation has been completed successfully storing data from said critical data area in addition as backup data.

7. The method according to claim 5, further comprising at some point of time checking said completion status field and, in case said completion status field does not indicate that a preceding write operation has been completed successfully, restoring previously stored data in said data storage area based on said stored backup data.

8. The method according to claim 7, wherein said checking of said completion status field and, if applicable, said restoring of data is carried out either before performing a respective write operation and/or before performing a respective read operation.

9. The method according to claim 1, wherein a part of said data storage area is defined as a critical data area, and wherein said write operation is a write operation only for storing data in said critical data area.

10. The method according to claim 1, wherein said completion status field is defined in at least one of:
said data storage area;
a register of said storage component; and
a high endurance memory part of said storage component.

11. The method according to claim 1, wherein said completion status field is updated by said storage component.

12. The method according to claim 1, wherein said completion status field is updated by a processing component external to said storage component.

13. An apparatus comprising:
a data storage area which is arranged for storing data in a respective write operation;
a completion status field which is arranged for being updated after a respective completed write operation to comprise an indication that said write operation has been completed successfully; and
a control portion adapted to control said write operation and to update said completion status field, wherein said control portion is further adapted to check before a respective write operation said completion status field and to update said completion status field, in case said completion status field comprises an indication that a preceding write operation has been completed successfully, such that said completion status field comprises an indication that a preceding write operation has not been completed successfully.

14. The apparatus according to claim 13, further comprising a buffer having a high endurance, a memory part having a high endurance, and a control portion, wherein said control portion is adapted to check said completion status field before a respective write operation, and, for the case said completion status field comprises an indication that a preceding write operation has been completed successfully, adapted to buffer data for said write operation in said buffer and to store address information for said buffered data in said memory part.

15. The apparatus according to claim 14, wherein said control portion is adapted to check said completion status field at some point of time and, for the case said completion status field comprises an indication that a preceding write operation has not been completed successfully, to restore data in said data storage area with data buffered in said buffer in accordance with associated address information stored in said memory part.

16. The apparatus according to claim 15, wherein said control portion is adapted to check said completion status field and, if applicable, to restore data at least one of before a respective write operation and before a respective read operation.

17. The apparatus according to claim 13, further comprising a backup data area which, for the case a write operation has been completed successfully, is arranged to store at least part of data stored in a respective write operation in said data storage area as backup data.

18. The apparatus according to claim 13, wherein said data storage area comprises a critical data area, wherein said apparatus further comprises a backup data area, and wherein, for the case a write operation has been completed successfully, said backup data area is arranged to store data stored in a respective write operation in said critical data area as backup data.

19. The apparatus according to claim 17, further comprising a control portion which is adapted to check said completion status field at some point of time, and which, for the case that said completion status field does not comprise an indication that a preceding write operation has been completed successfully, is adapted to restore previously stored data in said data storage area based on said stored backup data.

20. The apparatus storage component according to claim 19, wherein said control portion is adapted to check said completion status field and, if applicable, to restore data either before a respective write operation and/or before a respective read operation.

21. The apparatus according to claim 13, wherein a part of said data storage area is a critical data area, and wherein said completion status field is only adapted to be updated for write operations storing data in said critical data area.

22. The apparatus according to claim 13, wherein said completion status field is defined in at least one of:
said data storage area;
a register of said apparatus; and
a high endurance memory part of said apparatus.

23. A system comprising
a storage component with a data storage area, which is arranged for storing data in a respective write operation, and with a completion status field, which is arranged for being undated after a respective completed write operation to comprise an indication that said write operation has been completed successfully; and
a processing component which is adapted to provide data for a write operation in said storage component.

24. The system according to claim 23, wherein said processing component is adapted to control a respective write operation in said data storage area of said of said storage component and to update said completion status field of said storage component.

25. The system according to claim 23, wherein said storage component comprises a backup data area, and wherein said processing component is adapted to store at least part of data stored in a respective write operation in said data storage area as backup data in said backup data area.

26. The system according to claim 25, wherein said processing component is further adapted to check said completion status field at some point of time, and wherein, for the case that said completion status field does not comprise an indication that a preceding write operation has been completed successfully, said processing component is further adapted to restore previously stored data in said data storage area based on data stored in said backup data area.

27. The system according to claim 26, wherein said processing component is adapted to check said completion status field and, if applicable, to restore data at least one of before a write operation is performed and before a read operation is performed.

28. The system according to claim 23, wherein said storage component comprises a buffer having a high endurance and a memory part having a high endurance, wherein said processing component is adapted to check said completion status field before a respective write operation, and wherein, for the case said completion status field comprises an indication that a preceding write operation has been completed successfully, said processing component is adapted to buffer data for said write operation in said buffer and to store address information for said buffered data in said memory part.

29. The system according to claim 28, wherein said processing component is adapted to check said completion status field at some point of time and, for the case said completion status field comprises an indication that a preceding write operation has not been completed successfully, to restore data in said data storage area with data buffered in said buffer in accordance with associated address information stored in said memory part.

30. The system according to claim 29, wherein said processing component is adapted to check said completion status field and, if applicable, to restore data either before a write operation is performed and/or before a read operation is performed.

31. An apparatus comprising:
means for storing data in a respective write operation; and
means for being updated after a respective completed write operation to comprise an indication that said write operation has been completed successfully; and
means for controlling said write operation, for updating said means for being updated, for checking before a respective write operation said means for being updated, and for updating said means for being updated, in case said means for being updated comprise an indication that a preceding write operation has been completed successfully, such that said means for being updated comprise an indication that a preceding write operation has not been completed successfully.

* * * * *

UNITED STATES PATENT AND TRADEMARK OFFICE
CERTIFICATE OF CORRECTION

| | | |
|---|---|---|
| PATENT NO. | : 7,257,030 B2 | Page 1 of 1 |
| APPLICATION NO. | : 11/145527 | |
| DATED | : August 14, 2007 | |
| INVENTOR(S) | : Hyvönen et al. | |

It is certified that error appears in the above-identified patent and that said Letters Patent is hereby corrected as shown below:

At column 8, line 23, claim 1, line 14, please remove the word "undated" and replace with --updated--.

At column 10, line 7, claim 20, line 1, please delete the phrase "storage component".

At column 10, line 34, claim 24, line 3, please delete the second occurrence of the phrase "of said".

Signed and Sealed this

Eighteenth Day of December, 2007

JON W. DUDAS
*Director of the United States Patent and Trademark Office*